(12) United States Patent
Aston et al.

(10) Patent No.: US 8,416,972 B2
(45) Date of Patent: Apr. 9, 2013

(54) TRANSDUCER FOR VIBRATION ABSORBING, SENSING, AND TRANSMITTING

(75) Inventors: Martin Geoffrey Aston, Market Weighton (GB); Kamlesh Prajapati, Beverley Yorkshire (GB); Neil Munns, Northfleet Kent (GB); Christopher Tiler, Barnsley (GB)

(73) Assignee: FeONIC PLC, London (GB)

( * ) Notice: Subject to any disclaimer, the term of this patent is extended or adjusted under 35 U.S.C. 154(b) by 0 days.

(21) Appl. No.: 12/681,474

(22) PCT Filed: Oct. 3, 2008

(86) PCT No.: PCT/GB2008/050904
§ 371 (c)(1),
(2), (4) Date: Jun. 15, 2010

(87) PCT Pub. No.: WO2009/044209
PCT Pub. Date: Apr. 9, 2009

(65) Prior Publication Data
US 2010/0284554 A1    Nov. 11, 2010

(30) Foreign Application Priority Data
Oct. 3, 2007 (GB) .................................. 0719246.1

(51) Int. Cl.
*H04R 25/00* (2006.01)
(52) U.S. Cl. ............. 381/190; 310/15; 310/26; 335/215
(58) Field of Classification Search .................. None
See application file for complete search history.

(56) References Cited

U.S. PATENT DOCUMENTS

| | | | |
|---|---|---|---|
| 4,845,688 A | 7/1989 | Butler | |
| 5,880,542 A * | 3/1999 | Leary et al. | 310/26 |
| 7,569,952 B1 * | 8/2009 | Bono et al. | 310/15 |
| 2006/0175169 A1 | 8/2006 | Or et al. | |
| 2009/0010470 A1 * | 1/2009 | Wang | 381/353 |

FOREIGN PATENT DOCUMENTS

| | | |
|---|---|---|
| EP | 1785642 A2 | 5/2007 |
| WO | 99/38153 A1 | 7/1999 |
| WO | 02/076141 A2 | 9/2002 |
| WO | 2004/057912 A2 | 7/2004 |

OTHER PUBLICATIONS

PCT Search Report dated May 14, 2009 of Patent Application No. PCT/GB2008/050904 filed Oct. 3, 2008.

* cited by examiner

*Primary Examiner* — Duc Nguyen
*Assistant Examiner* — Taunya McCarty
(74) *Attorney, Agent, or Firm* — Maine Cernota & Rardin

(57) ABSTRACT

A hermetically sealed actuator design for absorbing and reducing the effect of sound or vibration energy from a vibrating surface. The device comprises a body (1) containing a magnetostrictive core (2-6) a reaction mass (7) for energizing the actuator by compression, and a bearing or lever system to control the movement of the reaction mass. The actuator has a foot (11) for receiving the vibration from the structure into the device and a sensor (13) for monitoring vibration levels. The device can also function as an audio transmitter whereby it vibrates the surface onto which it is mounted and can be used for audio trans-10 mission through the structure or noise and vibration reduction by driving the surface out of phase with the vibration received from the structure.

14 Claims, 6 Drawing Sheets

TRANSDUCER FOR VIBRATION ABSORBING, SENSING, AND TRANSMITTING

RELATED APPLICATIONS

This application is a 35 U.S.C. 371 U.S. National Stage Application of PCT International Application Serial No. PCT/GB2008/050904 filed Oct. 03, 2008 which claims benefit of U.K. Application Serial No. GB0719246.1 filed Oct. 03, 2007 both are herein incorporated in their entirety by reference.

FIELD OF THE INVENTION

This invention relates to a transducer for damping vibration energy from a surface. A proportion of this energy may be converted and stored as electrical energy.

BACKGROUND TO THE INVENTION

The primary purpose of the invention is to reduce sound or vibration transmitted through large structures (for example ships, oil rigs, bridges, buildings and other structures) by converting this movement into electrical energy.

It is already known that energy may be absorbed or harvested by converting the movement or vibration of a surface into electrical energy which can then be used as a power source or dissipated. However, previous applications have been on a smaller scale and traditionally preferred to use piezoelectric transducers. While such actuators can be used for small scale power harvesting, larger forces such as might be found in the scale of structures being considered (for example the hull of a large cruise ship) need to be an order of magnitude more powerful.

The transducer may also function as a sensor. This may replace, or, supplement existing sensing applications. In the example of bridges, the sensor signal may be used to monitor vibration levels from traffic.

Traditionally, to provide audio coverage for a large area would have required many speakers. However, if the structure is driven with an audio signal, wide coverage may be achieved with fewer sound sources and associated wiring and amplification.

SUMMARY OF THE INVENTION

According to the invention, there is provided a transducer for absorbing acoustic or vibration energy from a surface radiating audible sound or vibrations, the device comprising a body containing an actuator of the magnetostrictive type, comprising, a reaction mass, linear bearing or some other form of guide or sleeve and an arrangement of magnets, spacers and coil windings surrounding a core of Giant Magnetostrictive Material (GMM) generally to the same formulation as our previous patent application (European Patent Application Number 02708456.5, International Patent Number PCT/GB02/01111). When accelerated by the vibrational energy of the panel, the reaction mass component of the transducer imparts a force into the GMM element of the transducer. This results in a change in the magnetic properties of the GMM, this change manifests itself as a change in the magnetic field surrounding the GMM. This fluctuating magnetic field is used to induce an electric current in the coil surrounding the GMM. This electrical current may be absorbed into a connected power storage system such as a battery, capacitor or other power retaining solution, Preferably, the mass is in series with the actuation portion of the transducer within the enclosure in an axial arrangement, more preferably it runs in a bearing to support the mass. The bearing can be of a linear format or in another embodiment, by two smaller ring bearings. In an embodiment of either design, oil filling may be advantageous to reduce friction within the unit and minimise noise generated within the transducer.

It has been found that by constraining the movement to within the limits of the bearing running axially to the actuation direction is very effective however the design is not restricted to this permutation The transducer can also be used as a vibration generator or audio transducer whereby an electrical signal is applied to the coil windings which in turn generates a magnetic field causing the GMM element to change shape generating a vibration on the mounted surface. The coils windings for the absorbing or vibration generating function may be the same or separate for each function but wound on the same bobbin.

In a second embodiment of the invention the control of the axis of thrust is important as can be seen in our patent application (International Patent Application Number WO2004/057912 A3) for a transverse axis lever device. In this embodiment the vibration from the mounting surface is amplified by the mechanical lever system, such that the reaction mass works in conjunction with the compressive forces on the GMM amplifying the amount of compression and subsequent electrical energy generated.

Preferably, the transducer is a magnetostrictive actuator comprising a magnetostrictive element and an electromagnetic coil associated therewith, the element being mechanically connected to the foot, and the coil being energised by the vibration from the mounting surface so as to cause the element to deliver an output force to the power system for storage and subsequent reuse.

The transducer as with the first embodiment, can also be used as a vibration generator or audio transducer whereby an electrical signal is applied to the coil windings which in turn generates a magnetic field causing the GMM element to change shape and movement amplified by the lever generating a vibration on the mounted surface. The coils windings for the absorbing or vibration generating function may be the same or separate for each function but wound on the same bobbin.

It can be seen that the design is not limited to the use of magnetostrictive cores as defined and shown in our associated patent applications, and could benefit from multiple wound coils to distinguish between vibration at specific frequencies as per our previously mentioned patent. This could include multiple elements including piezo and other smart material exciters, flexi tensional devices similar to the one protected by patent (U.S. Pat. No. 4,845,688) transverse lever devices as per our own application referred to above and laminated smart materials that use any combination of the above.

Mass, spring type and coil windings may be selected to operate under different frequency regimes. In certain applications it may be desirable to combine two transducer topologies, for example low frequency element for noise reduction and higher frequency element for audio transmission. The optimal range of effectiveness of the devices can vary dependent on application but are in the region of 20 Hz-2000 Hz for vibration damping and 100 Hz-18 kHz for audio transmission.

Another embodiment of the device is to contain within its structure an integrated sensor such as a piezoelectric device or similar that senses vibrations from the mounting surface it is mounted onto so providing a reference that the control electronics can respond and react against. This might be for the purposes of sensing unusual or non-predicted vibrations, such that an alarm might be triggered or for vibration control applications where the sensor is used to detect vibration from the surface and the transducer is activated 180 degrees out of phase to cancel the vibration. Similarly this aspect of the invention could allow the device to be used as an accelerometer where a two way signal can be used to compensate for a specific vibrational circumstance for example on the hull of a ship where ice may be occasionally encountered and surface activation (vibration) may be required to remove it.

Another embodiment of the device is for application as a distributed mode loudspeaker fire alarm system, since the device can have improved fire resistance compared with conventional audio devices. In this implementation the transducer would normally be in the vibration damping mode. However, in response to an alarm signal, a pre-recorded message, announcement and/or warning sound could be transmitted into the structure.

The attachment of the device to the surface may be permanent or temporary, but in either case the foot that will be attached to the surface will be adhered or fastened to remain in intimate contact with the surface. As the environment in which the device operates will be frequently immersed in water, oil, diesel and other noxious elements found in the hull of a boat or structure the device will be designed to withstand this environment for many years operating in a safe and non hazardous manner throughout its lifetime.

The design of the transducer allows it to be operated as a sensor to allow, for example, monitoring of vibration. Further, by applying electrical signals to the transducer, audio signals may be transmitted into the structure on which the transducer is mounted. The design of the transducer is such that it functions in any mounting orientation.

BRIEF DESCRIPTION OF THE DRAWINGS

Some embodiments of the invention are described, as examples only, with reference to the drawings, in which.

DETAILED DESCRIPTION OF THE ILLUSTRATED EMBODIMENTS

Figure 1:
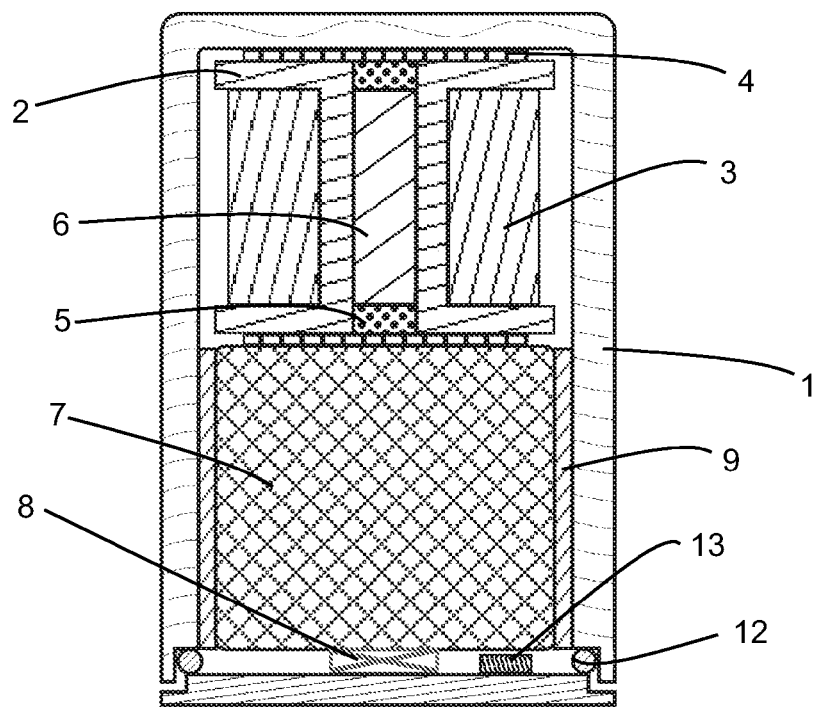
FIG. 1 is a sectional elevation of the axial device according to the first embodiment of the invention featuring a linear bearing.
Figure 2:
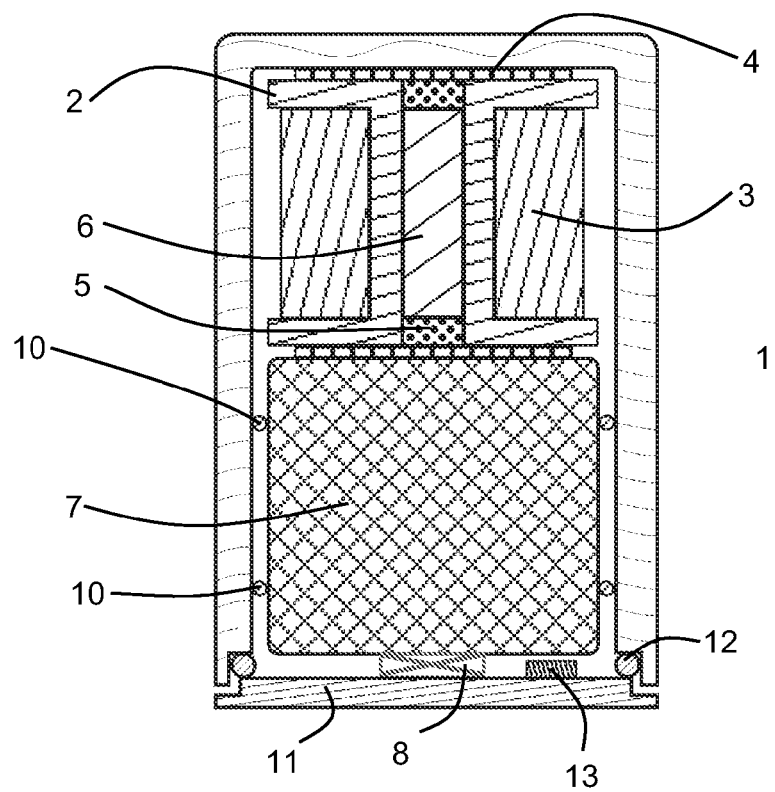
FIG. 2 is a sectional elevation of the axial device according to the first embodiment of the invention featuring dual bearing rings.

Referring to FIG. 1, the absorber device comprises a casing 1 containing an core assembly 2-6 in intimate contact with a reaction mass 7 pretensioned against the actuator by a spring 8 which keeps the device in tension. The reaction mass is mounted within a linear bearing 9 or alternatively two annular bearing rings, 10 as shown in FIG. 2. The core assembly consists of various parts including a moulded bobbin 2, coil 3, magnets 4, spacers 5 and GMM element 6. The core assembly 2-6 is of the type described and claimed in our co-pending International Patent Application, European Patent Application Number 02708456.5. The foot 11 is securely fastened to case 1. O-ring 12 prevents water ingress. A vibration sensor such as an accelerometer 13 is mounted on the foot 11.

Figure 3:
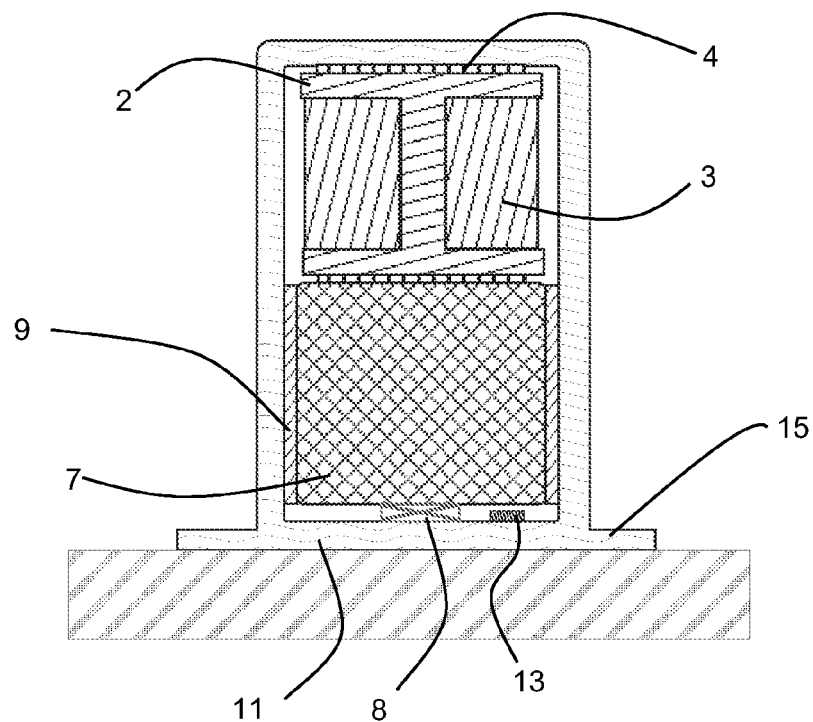
FIG. 3 is a sectional elevation of the axial device according to the first embodiment of the invention featuring an external mounting flange.
Figure 4:
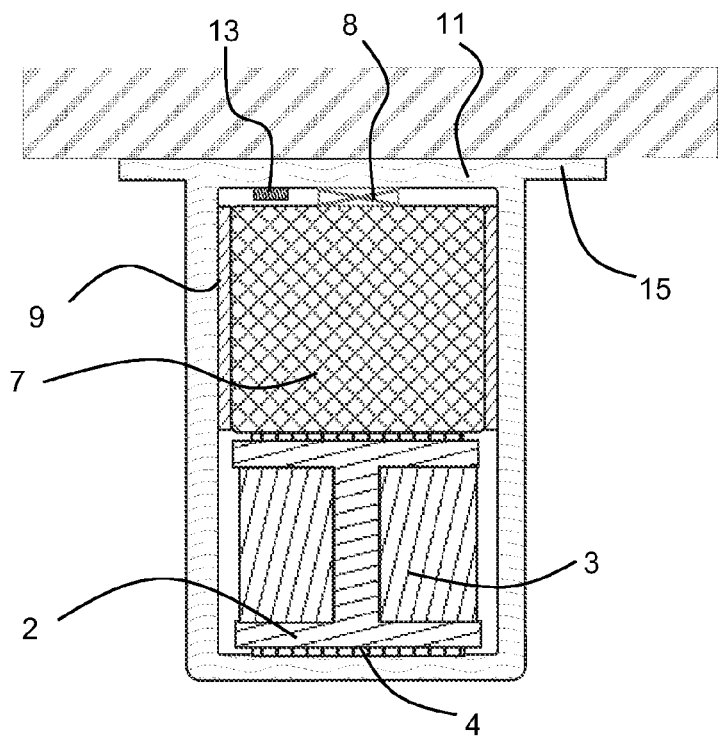
FIG. 4 is a sectional elevation of the axial device according to the first embodiment of the invention showing an alternate mounting position.

The whole device is connected to an external energy storage device (not shown). In use, the device is permanently or temporarily attached to a surface to which vibrations to be absorbed with the foot 11 by means of either a permanent adhesive, or fixings through a modified foot featuring mounting flanges 15 as shown in FIGS. 3 and 4.

Figure 5:
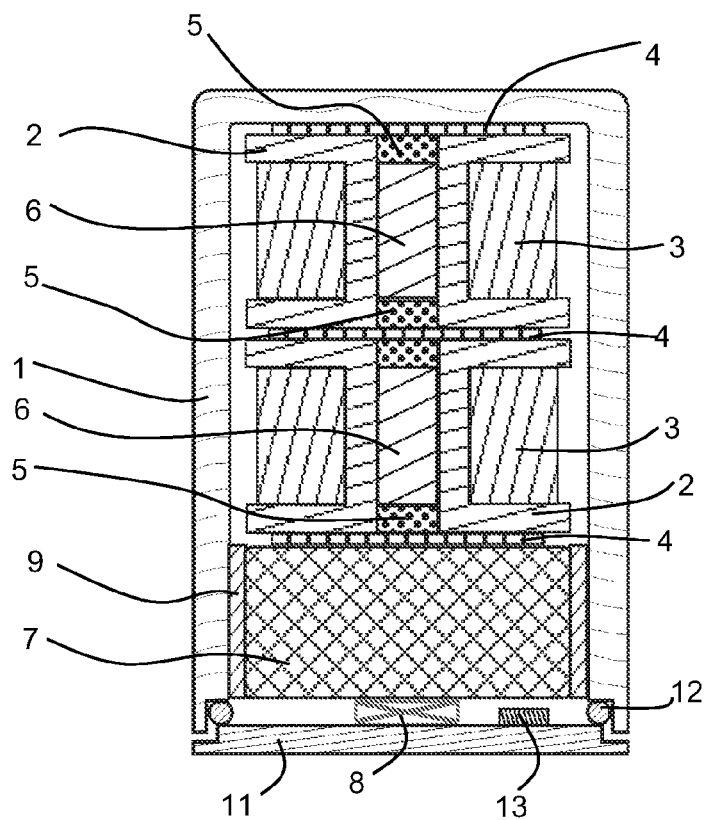
FIG. 5 is a sectional elevation of the axial device according to the first embodiment of the invention featuring a double GMM core.
Figure 6:
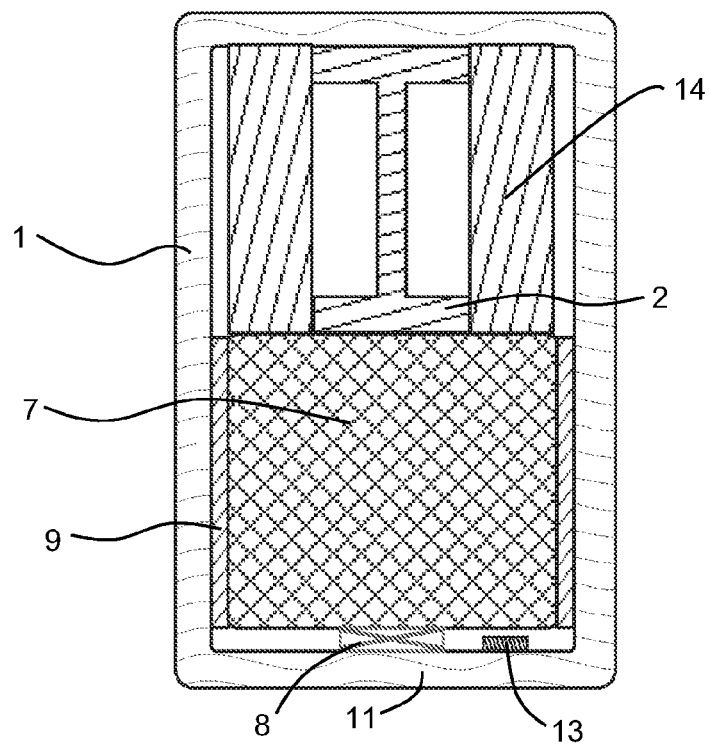
FIG. 6 is a sectional elevation of the axial device according to the first embodiment of the invention featuring an alternate GMM core construction.

FIG. 5 shows a double transducer stack, which might be used to increase efficiency. FIG. 6 shows an alternative transducer arrangement whereby the disc magnets 4 shown in FIG. 1 are replaced with a cylindrical magnet 14, to reduce the diameter of the core.

Figure 7:
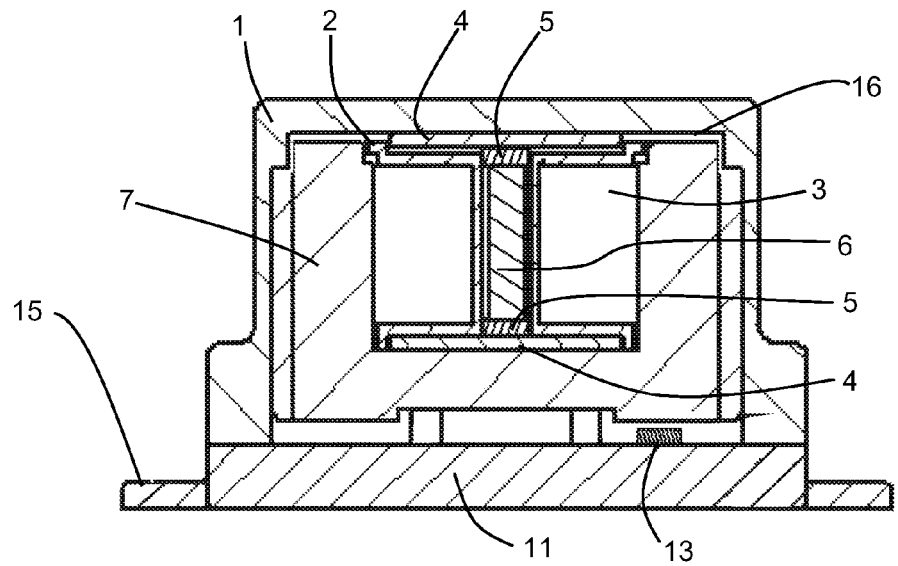
FIG. 7 is a sectional elevation of the axial device according to the first embodiment of the invention showing a more compact version of the core build.

FIG. 7 shows a more compact arrangement where the actuator core is encompassed by the reaction mass 7 in order to create a lower profile device. Most components are as per FIG. 1. However, this embodiment also includes the mounting flange 15 and use of oil to fill the cavity 16.

Figure 8:
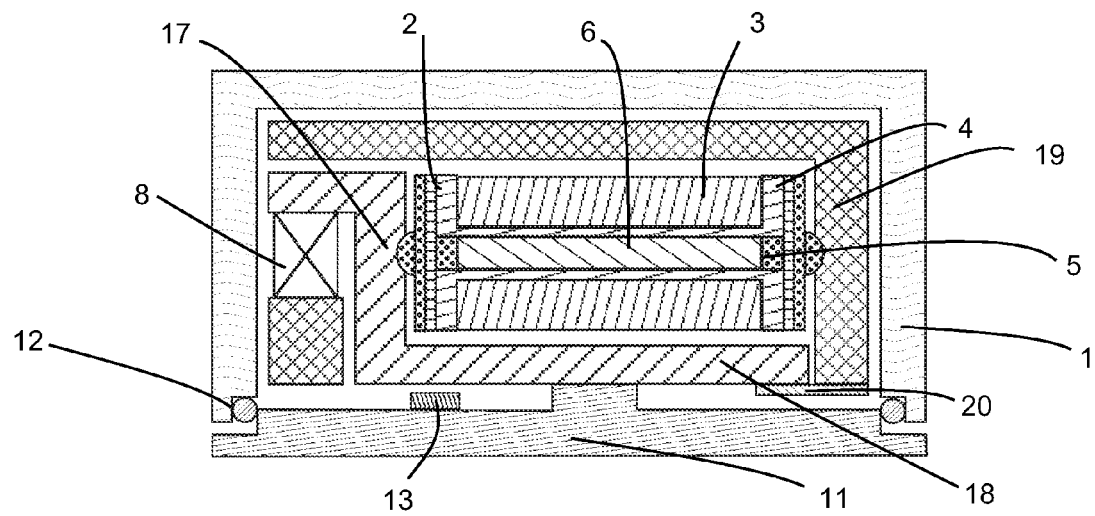
FIG. 8 is a sectional elevation of the transverse device according to the second embodiment of the invention featuring a single GMM core.

FIG. 8 shows an alternative embodiment. In this implementation, the actuator assembly identified in description of FIG. 1, is replaced with a transverse axis lever device as detailed in co-pending patent application number WO2004/057912A3. The case 1, foot 11 and O-ring 12 remain as shown in FIG. 1. However, the internal components of the case 1 are replaced by the transverse axis lever device, comprising a core assembly of bobbin 2, coil 3, magnet 4, spacer 5, GMM 6 & domed spacer 17. The core is located within the transducer assembly, and comprises a base-plate 18 attached to body 19 with hinge 20. The transducer assembly is held in tension by spring 8.

Figure 9:
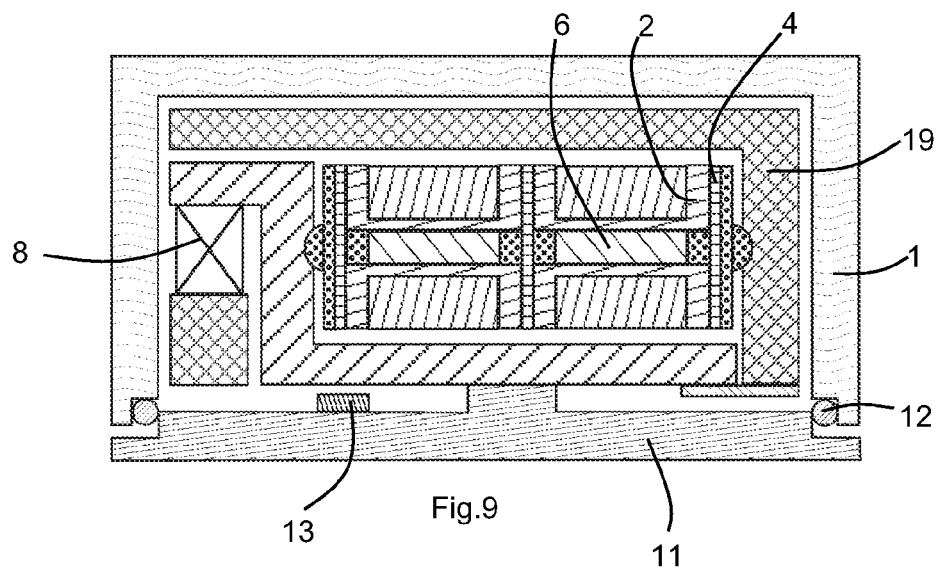
FIG. 9 is a sectional elevation of the transverse device according to the second embodiment of the invention featuring dual GMM cores.

FIG. 9 shows an enhancement of this embodiment which utilises two core assemblies to increase either energy harvesting efficiency, audio quality, or to optimise transducer for applications where it is used as both energy harvesting device and acoustic source.

Figure 10:
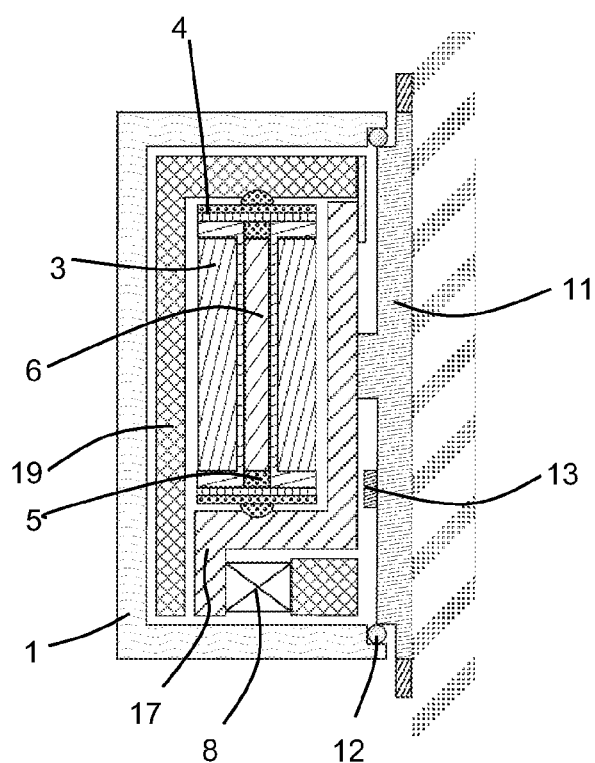
FIGS. 10-12 are sectional elevations of the transverse device according to the second embodiment of the invention showing alternate mounting axis and methods.
Figure 11:
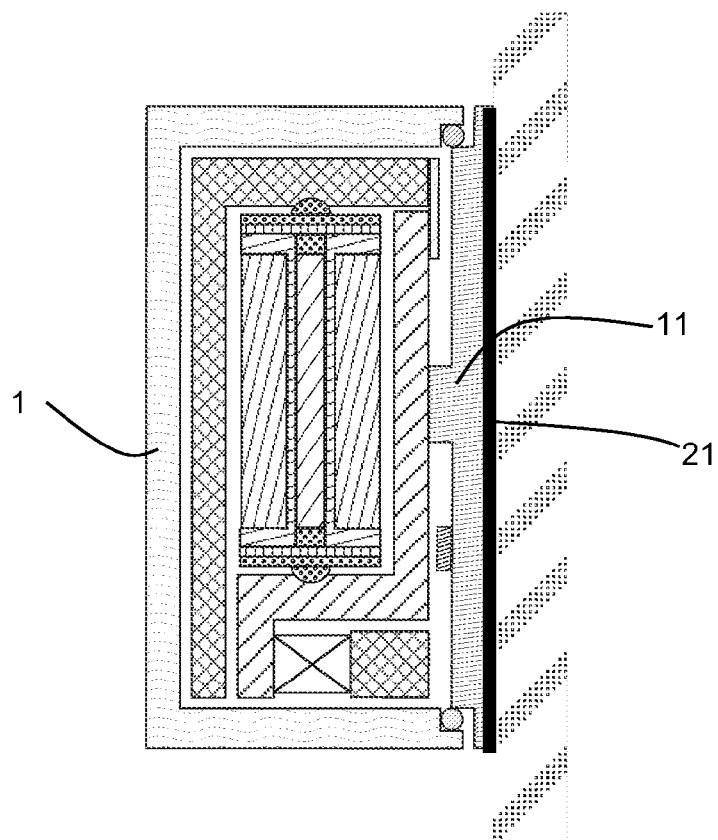
Figure 12:
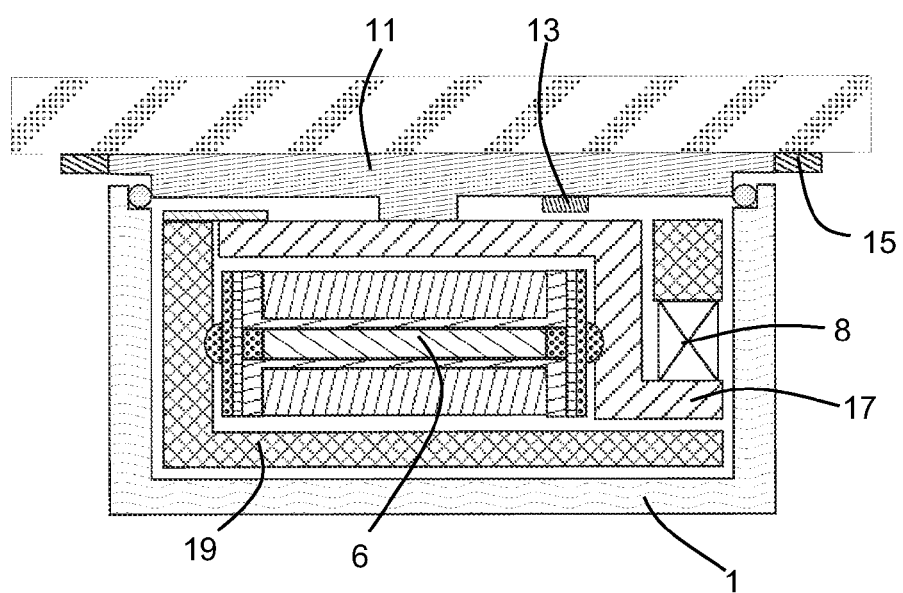

FIG. 10 shows the transverse axis lever device embodiment mounted vertically with mounting flanges. FIG. 11 shows the same actuator arrangement. However, in this implementation the transducer is adhered with an adhesive or double sided adhesive pad 21. FIG. 12 illustrates that the device may also be mounted horizontally using either flanges, as illustrated, or adhesive as FIG. 11.

The invention claimed is:
1. A device for harvesting energy by absorbing vibrations from a surface, said device comprising:
a body including a reaction mass and a magnetostrictive actuator, said magnetostrictive actuator comprising:
at least one coil surrounding an element of giant magnetostrictive material (GMM);

said at least one coil being electrically connected to a power storage system;

said magnetostrictive actuator having a foot for coupling said vibrations into said element of giant magnetostrictive material, thereby inducing an electric current in said at least one coil, whereby said device removes energy from said surface; and said magnetostrictive actuator being mounted between said body and a base-plate, said base-plate being attached to said body with a hinge, and said foot being mounted on said base-plate, whereby movement of said foot in a first axis is transmitted to said GMM element in a second axis transverse to said first axis.

2. The device of claim 1, wherein said reaction mass is slidably mounted within said body.

3. The device of claim 2, wherein said reaction mass is mounted within a linear bearing within said body.

4. The device of claim 2, wherein said reaction mass is mounted in two bearing rings within said body.

5. The device of claim 1, wherein a vibration sensor is mounted within said body to provide a signal to control electronics for said device.

6. The device of claim 5, wherein said vibration sensor is an accelerometer.

7. The device of claim 5, wherein said vibration sensor is a piezoelectric device.

8. The device of claim 1, wherein said magnetostrictive actuator is adapted to provide a vibration damping function and an audio and vibration transmitting function.

9. The device of claim 8, wherein an additional coil surrounds said GMM element, said additional coil being connected to an audio or vibration signal source.

10. The device of claim 1, wherein said body encloses said reaction mass and said magnetostrictive actuator in a fluid-tight enclosure.

11. The device of claim 9, wherein said body encloses said reaction mass and said magnetostrictive actuator in a fluid-tight enclosure.

12. The device of claim 6, wherein said magnetostrictive actuator is adapted to provide a vibration damping function and an audio and vibration transmitting function.

13. The device of claim 1, wherein an additional coil surrounds said GMM element, said additional coil being connected to an audio or vibration signal source.

14. The device of claim 7, wherein said magnetostrictive actuator is adapted to provide a vibration damping function and an audio and vibration transmitting function.

* * * * *